(12) United States Patent
Matsuo et al.

(10) Patent No.: US 7,837,497 B1
(45) Date of Patent: Nov. 23, 2010

(54) ELECTRONIC DEVICE AND FLEXIBLE PRINTED WIRING BOARD

(75) Inventors: Hiroyuki Matsuo, Ome (JP); Tsuyoshi Kozai, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/715,287

(22) Filed: Mar. 1, 2010

(30) Foreign Application Priority Data

May 27, 2009 (JP) .............................. 2009-127890

(51) Int. Cl.
*H01R 12/24* (2006.01)
(52) U.S. Cl. ...................... 439/492; 439/495; 439/951
(58) Field of Classification Search .................. 439/67, 439/77, 492, 494, 495, 499, 951
See application file for complete search history.

(56) References Cited

U.S. PATENT DOCUMENTS

| | | | |
|---|---|---|---|
| 7,210,942 B2 * | 5/2007 | Uchida et al. ................. | 439/67 |
| 7,232,315 B2 * | 6/2007 | Uchida et al. ................. | 439/67 |
| 7,238,044 B2 * | 7/2007 | Uchida et al. ............... | 439/492 |
| 7,261,569 B2 * | 8/2007 | Uchida et al. ................. | 439/67 |
| 7,497,695 B2 * | 3/2009 | Uchida et al. ................. | 439/67 |
| 2002/0045381 A1 * | 4/2002 | Ishii et al. .................... | 439/495 |
| 2006/0292911 A1 * | 12/2006 | Ning .......................... | 439/260 |

FOREIGN PATENT DOCUMENTS

| | | |
|---|---|---|
| JP | 10-190157 | 7/1998 |
| JP | 2000-277880 | 10/2000 |
| JP | 2002-124347 | 4/2002 |

* cited by examiner

*Primary Examiner*—Tho D Ta
(74) *Attorney, Agent, or Firm*—Knobbe Martens Olson & Bear LLP

(57) ABSTRACT

According to one embodiment, an electronic device includes a connector, and a flexible printed wiring board having a board main body provided with a first surface with a conductor provided thereon, a second surface opposite to the first surface, and a front end contacting the connector, and a reinforcing plate contacting the second surface at the front end to reinforce the board main body. A projection is provided on the connector in contact with the flexible wiring board. The reinforcing plate includes a recess portion in which the projection is fitted. The recess portion has a space increased in size toward and opening to an end face of the reinforcing plate corresponding to the front end, and an opening provided in the end face and communicating with the space.

15 Claims, 10 Drawing Sheets

ELECTRONIC DEVICE AND FLEXIBLE PRINTED WIRING BOARD

CROSS-REFERENCE TO RELATED APPLICATIONS

This application is based upon and claims the benefit of priority from Japanese Patent Application No. 2009-127890, filed May 27, 2009, the entire contents of which are incorporated herein by reference.

BACKGROUND

1. Field

One embodiment of the present invention relates to an electronic device provided with a flexible printed wiring board that is connected to a connector.

2. Description of the Related Art

Jpn. Pat. Appln. KOKAI Publication No. 10-190157 discloses an electronic device that employs a flexible printed wiring board provided with a coverlay film for protecting conductor patterns formed on the board. The flexible printed wiring board has a front portion that comprises an exposed portion at which the conductor patterns are exposed from the coverlay film, and a dam portion formed integral with the coverlay film to partition the conductor patterns. The width of the dam portion is gradually reduced toward its front end.

In the flexible printed wiring board, the dam portion has a function of guiding a connector chip when the connector is engaged with the wiring board, thereby preventing the connector chip from being mounted on the dam.

However, in the above-mentioned conventional flexible printed wiring board, there is no consideration as to how to guide the connector along the width of the wiring board when the connector is engaged with the wiring board. For example, although a guide is formed for preventing the connector from being displaced along the longitudinal axis of the connector engagement port, there is no means for guiding the flexible printed wiring board to a preset position along an axis that intersects the longitudinal axis of the connector engagement port. Accordingly, when the flexible printed wiring board is engaged with the connector, it is necessary to pay attention not to damage the coverlay film, which degrades the convenience.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, an electronic device includes a connector, and a flexible printed wiring board having a board main body provided with a first surface with a conductor provided thereon, a second surface opposite to the first surface, and a front end contacting the connector, and a reinforcing plate contacting the second surface at the front end to reinforce the board main body. A projection is provided on the connector in contact with the flexible wiring board. The reinforcing plate includes a recess portion in which the projection is fitted. The recess portion has a space increased in size toward and opening to an end face of the reinforcing plate corresponding to the front end, and an opening provided in the end face and communicating with the space.

Referring now to FIGS. 1 to 8, an electronic device according to a first embodiment will be described. In the description below, the near side to the user (that is, user side) is defined as front F, the far side from the user is rear R, the left-hand side of the user is left, the right-hand side of the user is right, the upper side from the user's position is up and the lower side from the user's position is down.

Figure 1:
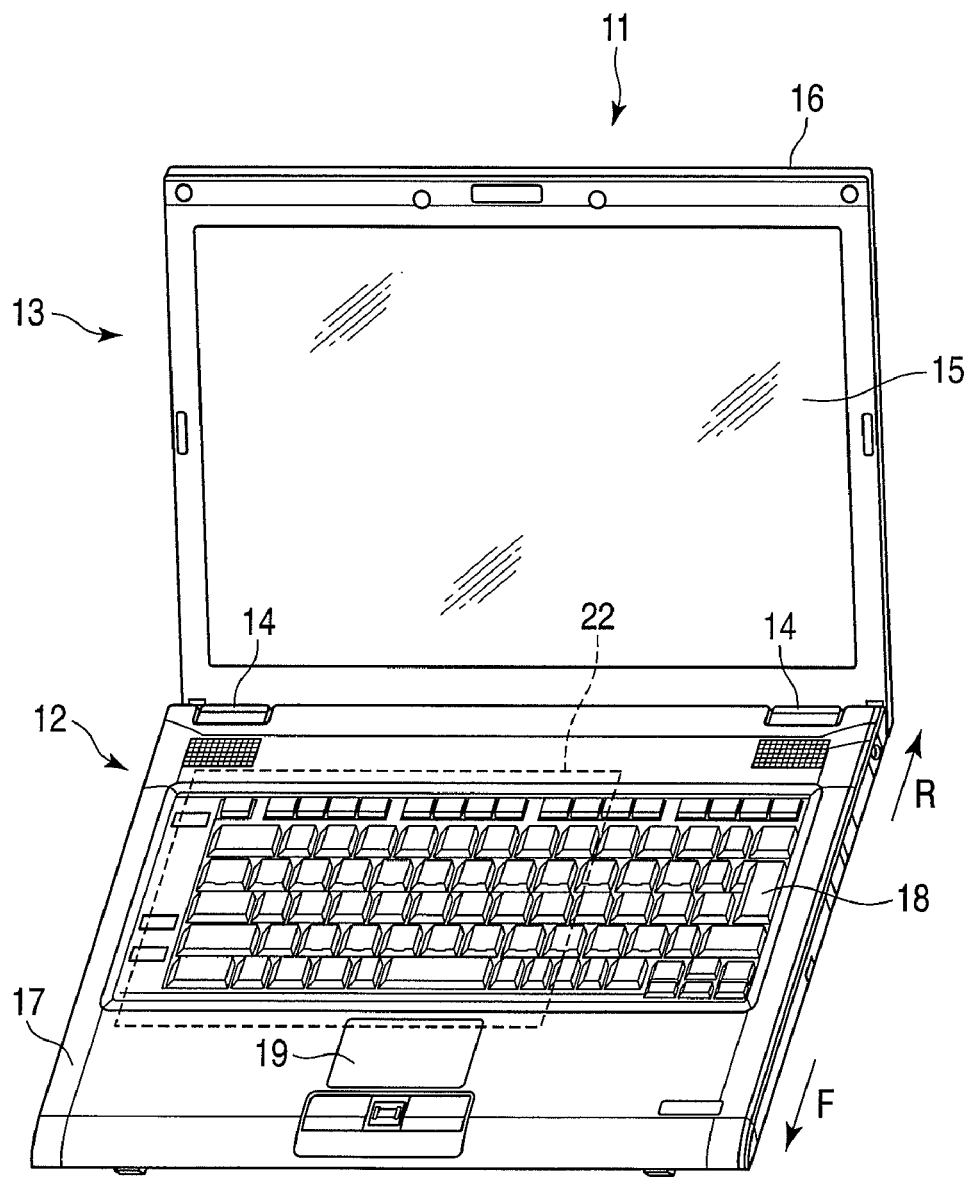
FIG. 1 is an exemplary perspective view of a portable computer according to a first embodiment.

As shown in FIG. 1, a portable computer 11 as an example of the electronic device of the first embodiment comprises a main unit 12, a display unit 13, and hinges 14 provided between the main unit 12 and the display unit 13. The hinges 14 support the display unit 13 so that the display unit can rotate.

As shown in FIG. 1, the display unit 13 comprises a liquid crystal display 15 as a display example, and a synthetic resin cover 16 enclosing the liquid crystal display 15.

Figure 2:
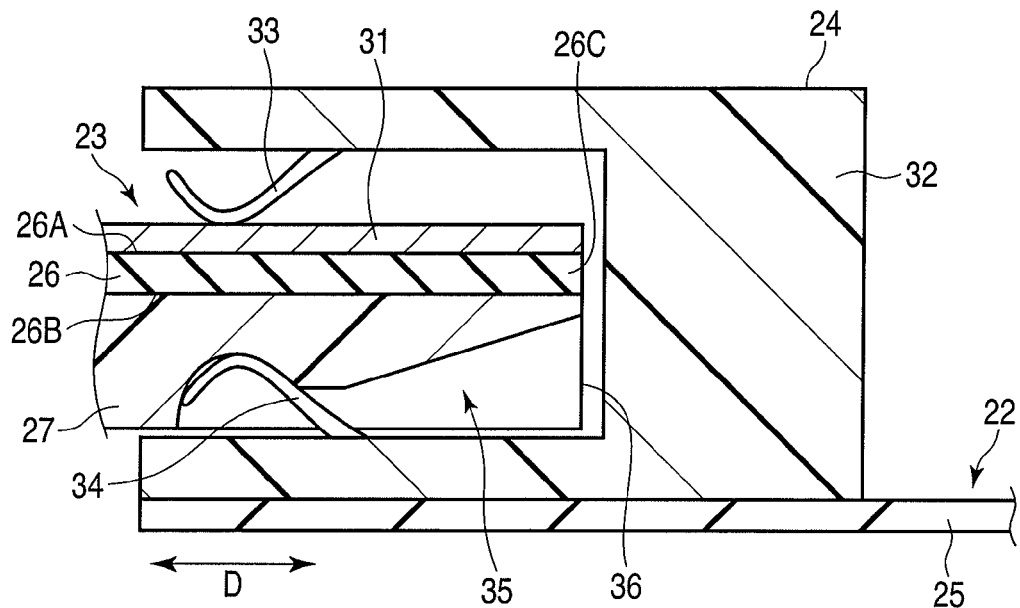
FIG. 2 is an exemplary longitudinal sectional view of a flexible printed wiring board and a connector that are housed in a case of the main unit of the portable computer of FIG. 1.

As can be seen from FIGS. 1 and 2, the main unit 12 comprises a case 17 as an outer envelope, a keyboard 18 and a touch pad 19 on the case 17, a printed circuit board 22 housed in the case 17, a flexible printed wiring board 23 provided independently of the printed circuit board 22, and a connector 24 electrically connecting the printed circuit board 22 to the flexible printed wiring board 23.

The printed circuit board 22 includes a printed wiring board 25, and circuit components mounted on the printed wiring board 25. The connector 24 is mounted on the printed circuit board 22.

The flexible printed wiring board 23 comprises a board main body 26, and a reinforcing plate (reinforcing member) 27 for reinforcing the board main body 26. An adhesive is interposed between the board main body 26 and the reinforcing plate 27. The board main body 26 has a first surface 26A, a second surface 26B opposite to the first surface 26A, and a front end 26C to be brought into contact with the connector 24. Conductors 31 are provided on the first surface 26A. The conductors 31 are formed of, for example, copper foil.

The connector 24 comprises a housing 32 surrounding the periphery of the front end of the board main body 26, first contacts 33 (only one of which is shown) to be brought into contact with the conductors 31 (only one of which is shown) of the board main body 26, and second contacts 34 (only one of which is shown) to be brought into contact with the reinforcing plate 27 of the flexible printed wiring board 23. The first and second contacts 33 and 34 have their tips bent to provide plate springs. The first and second contacts 33 and 34 are examples of projections that project substantially perpendicular to the line of an insertion direction D in which the flexible printed wiring board 23 is inserted. The first and second contacts 33 and 34 are electrically connected to the printed circuit board 22.

For example, the first contacts 33 are aligned with the second contacts 33 in the direction D in which the flexible printed wiring board 23 is inserted. The connector 24 is a so-called top and bottom double contacts type connector. In the first embodiment, the first contacts 33 are made to be brought into contact with the conductors 31, and the second contacts 34 are made to be brought into contact with the reinforcing plate 27. However, this may be modified such that the first contacts 33 are made to be brought into contact with the reinforcing plate 27, and the second contacts 34 are made to be brought into contact with the conductors 31.

Figure 3:
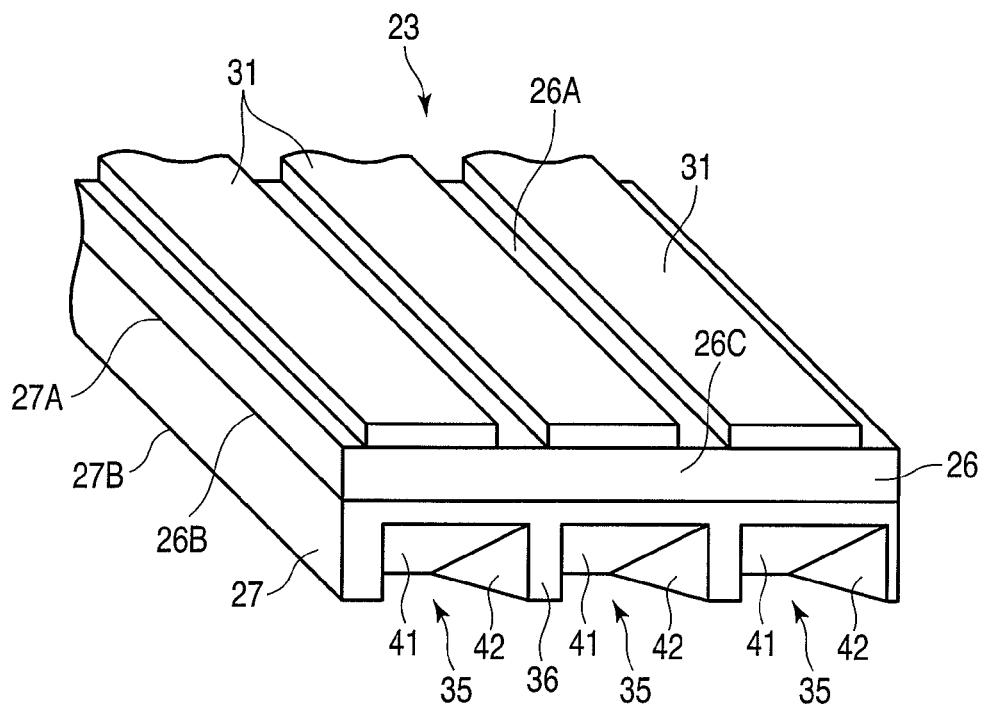
FIG. 3 is an exemplary perspective view of the flexible printed wiring board shown in FIG. 2.
Figure 4:
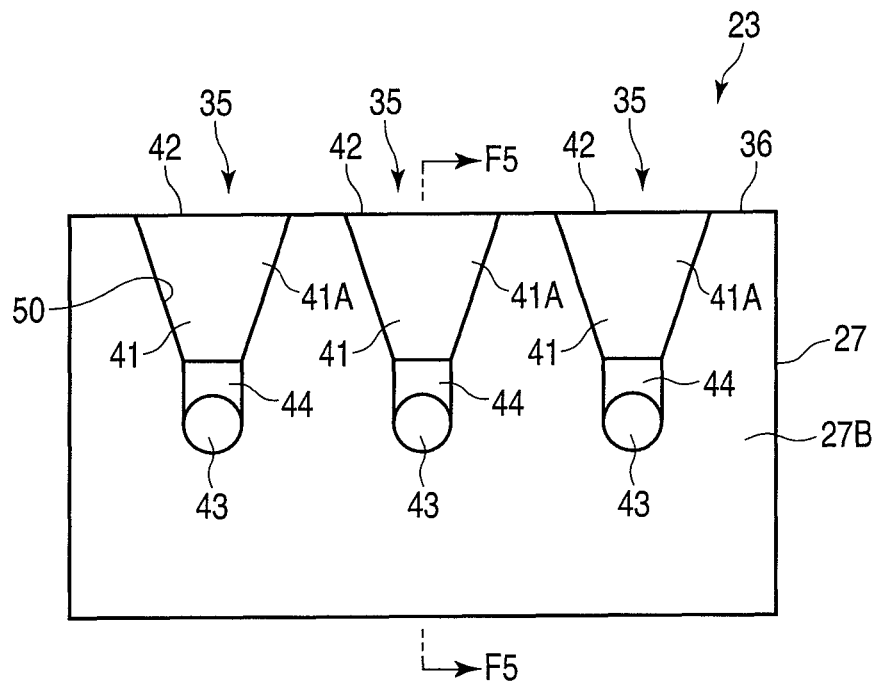
FIG. 4 is an exemplary bottom view of the flexible printed wiring board shown in FIG. 3.
Figure 5:
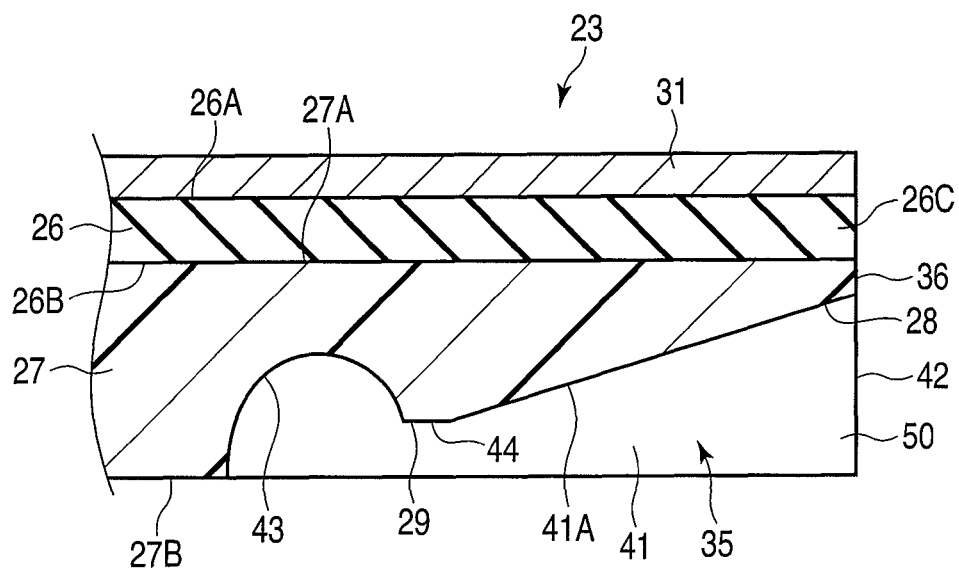
FIG. 5 is an exemplary sectional view taken along line F5-F5 of FIG. 4.

The reinforcing plate 27 is formed of, for example, polyimide or polyethylene terephthalate (PET), and is a thick rectangular plate as shown in FIGS. 3 to 5. The reinforcing plate 27 is attached to the second surface 26B of the board main body 26. The reinforcing plate 27 includes a first surface 27A on which the board main body 26 is attached, a second surface 27B opposite to the first surface 27A, and recess portions 35 formed in the second surface 27B for receiving the second contacts 34. The reinforcing plate 27 also includes end faces 36 aligned with the front end 26C of the board main body 26, an end portion 28, and a reinforcing portion 29 that is thicker than the end portion 28.

The recess portions 35 each includes a wall 50 that has a tilted and tapered surface 41A, and defines an opening 42 opening at the end face 36, an inner space 41, and an innermost recess 43 communicating with the inner space 41 and the opening 42. The surface 41A is tilted such that the depth of the recess portion 35 defined by the same is reduced toward the inside. The tapered surface 41A of the wall 50 extends from the end portion 28 to the reinforcing portion 29.

The recess 43 is formed in the reinforcing portion 29 and is deeper than a peak portion 44 described later. The recess 43 is formed like a dome to receive the projection of each second contact 34. The space 41, the opening 42 and the recess 43 are formed by processing the reinforcing plate 27 using a laser. The depths of the space 41 and the recess 43 are adjusted by controlling the energy of the laser and the number of shots of the laser. This enables each recess portion 35 to be formed at a high accuracy with a tolerance of ±30 μm. Recently, the positioning accuracy of the flexible printed wiring board 23 and the connector 24 has become important in accordance with an increase in the scale of integration of the components in the flexible printed wiring board 23, and in accordance with an increase in the number of the contacts of the connector 24.

In the first embodiment, since a laser is used to form the recess portions 35, the recess portions 35 can be formed at high accuracy, and hence increases in the scale of integration of the components in the flexible printed wiring board 23 can be smoothly dealt with.

Figure 6:
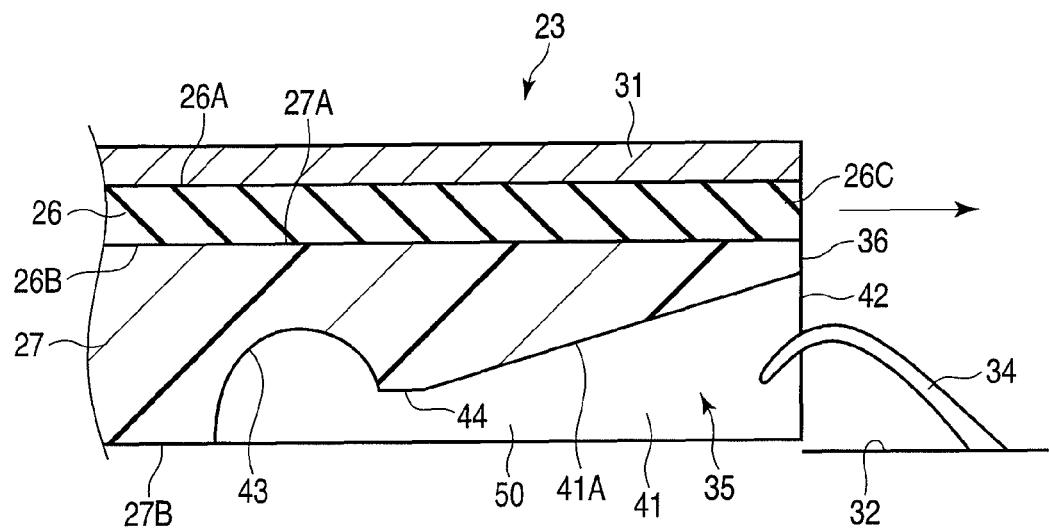
FIG. 6 is an exemplary sectional view illustrating a state in which the front end of the flexible printed wiring board shown in FIG. 5 starts to be inserted into the connector.
Figure 7:
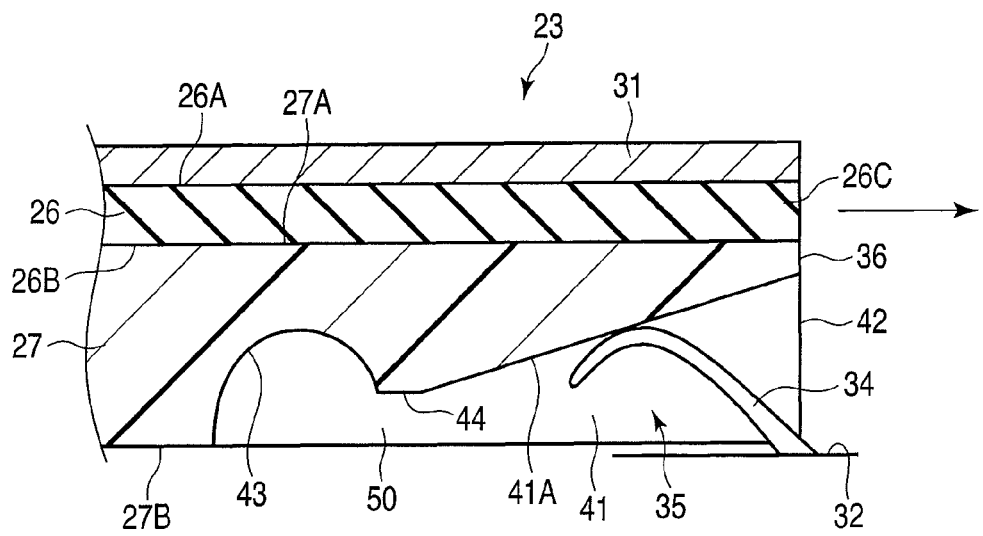
FIG. 7 is an exemplary sectional view illustrating a state in which the second contact of the connector shown in FIG. 6 contacts the bottom of the recess portion of the flexible printed wiring board.
Figure 8:
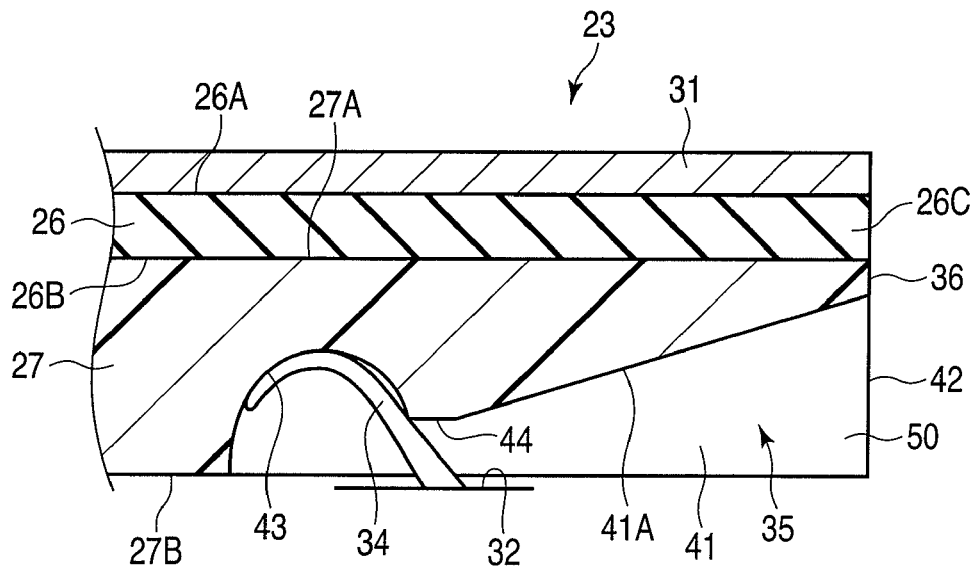
FIG. 8 is an exemplary sectional view illustrating a state in which the second contact of the connector shown in FIG. 7 is fitted in the recess portion of the flexible printed wiring board.

Referring then to FIGS. 6 to 8, the operation of fixing the flexible printed wiring board 23 to the connector 24 will be described. The connector 24 is beforehand fixed to the printed circuit board 22.

As shown in FIG. 6, when the front end 26C of the flexible printed wiring board 23 is inserted into the connector 24, the tip of the second contact 34 of the connector 24 enters the recess portion 35 of the flexible printed wiring board 23 through the opening 42 of the same. In this state, the front end 26C of the flexible printed wiring board 23 is further forwarded. At this time, the projection of the second contact 34 is brought into contact with the tilted surface 41A of the recess portion 35 as shown in FIG. 7. When the front end 26C of the flexible printed wiring board 23 is yet further forwarded, the second contact 34 is guided along the tilted surface 41A of the recess portion 35. After the second contact 34 passes through the peak portion 44 of the recess portion 35 at which the recess portion 35 is shallowest, it is fitted into the recess 43 as shown in FIG. 8. This state is a so-called locked state in which the flexible printed wiring board 23 is prevented from being unintentionally disengaged from the connector 24. Thus, the flexible printed wiring board 23 is fixed to the connector 24.

As described above, the portable computer 11 according to the first embodiment comprises the connector 24 including projections to be brought into contact with the flexible printed wiring board 23; and the flexible printed wiring board 23 including the board main body 26 provided with the first surface 26A on which the conductors 31 are mounted, the second surface 26B opposite to the first surface 26A, and the front end 26C to be brought into contact with the connector 24, and also including the reinforcing plate 27 attached to the second surface 26B. The reinforcing plate 27 is disposed to receive the projections of the connector 24, and has a surface on which the board main body is mounted, and an opposite surface. The opposite surface has recess portions 35. Each recess portion 35 includes a wall 50 that defines an opening 42 opening at the end face 36 aligned with the front end 26C, an inner space 41, and an innermost recess 43 communicating with the inner space 41 and the opening 42.

By virtue of the structure that incorporates the reinforcing plate 27 having the recess portions 35 for receiving the projections of the connector 24, the flexible printed wiring board 23 can be fixed to the connector 24 with a sufficient mechanical strength. Further, since the recess portions 35 are formed in the reinforcing plate 27 having a sufficient strength, the flexible printed wiring board 23 can be processed easily and hence produced at a high yield of products. Further, since the space 41 is increased in size toward the end face 36, the flexible printed wiring board 23 can be correctly positioned in the connector 24 even when the flexible printed wiring board 23 is displaced in a direction parallel to the surface of the reinforcing plate 27. As a result, the flexible printed wiring board 23 can be smoothly connected to the connector 24.

The depth of the recess portion 35 is increased toward the end face 36. By virtue of this structure, the flexible printed wiring board 23 can be guided not only along the surface of the reinforcing plate 27, but also along the width of the reinforcing plate 27. As a result, even when the flexible printed wiring board 23 is misaligned with the second contact 34 along the width of the reinforcing plate 27, it can be guided to its correct position, thereby realizing smooth attachment of the wiring board 23. Further, since the reinforcing plate 27 has a preset thickness, the recess portion 35 can be more easily processed to have a depth increased toward the end face 36, than in the case of processing a thin coverlay film.

The recess portion 35 has the recess 43. The recess 43 is formed at the opposite side of the opening 42 and is deeper than the peak portion 44. This structure can lock the second contacts 34 in the respective recesses 43, and hence the flexible printed wiring board 23 can be prevented from being unintentionally detached from the connector 24. Further, when the flexible printed wiring board 23 is deeply inserted in the connector 24 to thereby cause the second contacts 34 to be press-fitted into the recesses 43, the user can confirm that the flexible printed wiring board 23 has been correctly inserted in the connector 24. As a result, the flexible printed wiring board 23 is prevented from being excessively pushed into the connector 24, or from being loosely engaged with the same, thereby realizing smoother attachment of the flexible printed wiring board 23.

The projections include the first contacts 33 to be brought into contact with the conductors 31, and the second contacts 34 to be brought into contact with the reinforcing plate 27, and the first and second contacts 33 and 34 are plate spring members. Since in this structure, the first and second contacts 33 and 34 can be made flexible, the resistance of the flexible printed wiring board 23 that occurs when the board 23 is inserted into the connector 24 can be reduced, thereby realizing further smooth attachment of the board 23.

The connector 24 is a top and bottom double contacts type connector. Accordingly, the flexible printed wiring board 23 can be connected to the connector 24 without considering the front and back sides of the board 23. This being so, in the electronic device, the freedom degree of the layout of the flexible printed wiring board 23 and the connector 24 can be enhanced. Since an existing top and bottom double contacts type connector can be used as the connector 24, it is not necessary to design a new connector, which reduces the manufacturing cost.

Figure 9:
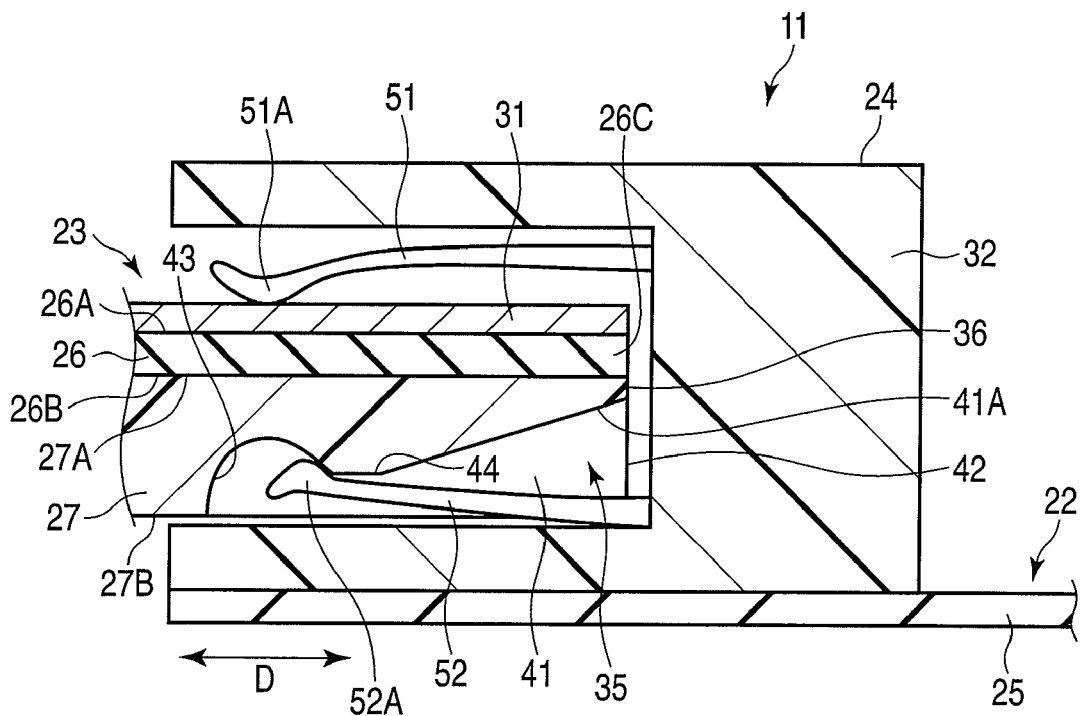
FIG. 9 is an exemplary longitudinal sectional view of a flexible printed wiring board and a connector that are incorporated in a portable computer according to a modification of the first embodiment.

Referring then to FIG. 9, a modification of the first embodiment will be described. In this modification, the flexible printed wiring board 23 has the same structure as that of the first embodiment, but the connector 24 includes first and second contacts 51 and 52 that differ in shape from the contacts of the first embodiment. In the modification, the different elements will be mainly described, and the similar elements are denoted by the corresponding reference numbers and will not be described.

The connector 24 of the modification is a so-called top and bottom double contacts type connector. The first and second contacts 51 and 52 are formed asymmetrical. The first and second contacts 51 and 52 are examples of projections. The first contact 51 has a projection 51A near its tip, which projects to a conductor. The second contact 52 has a projection 52A near its tip, which has a shape different from the first contact 51, and is misaligned with the projection 51A in the direction D in which the flexible printed wiring board 23 is inserted.

In the modification, when the front end 26C of the flexible printed wiring board 23 is inserted into the connector 24, the tip of the second contact 52 enters the opening 42 of the recess portion 35. When the front end 26C of the flexible printed wiring board 23 is further forwarded, the second contact 52 is downwardly guided along the tilted surface 41A of the recess portion 35. After the second contact 52 passes the peak portion 44, the projection 52A of the second contact 52 is fitted into the recess 43 as shown in FIG. 9. Thus, the flexible printed wiring board 23 is locked with respect to the connector 24.

In the modification, even when contacts formed asymmetrical with each other are used, the flexible printed wiring board 23 can be connected smoothly. As described above, the first and second contacts 51 and 52 may be formed asymmetrical with respect to each other, or may be misaligned with each other in the direction D in which the flexible printed wiring board 23 is inserted. Thus, these contacts can have various shapes.

Figure 10:
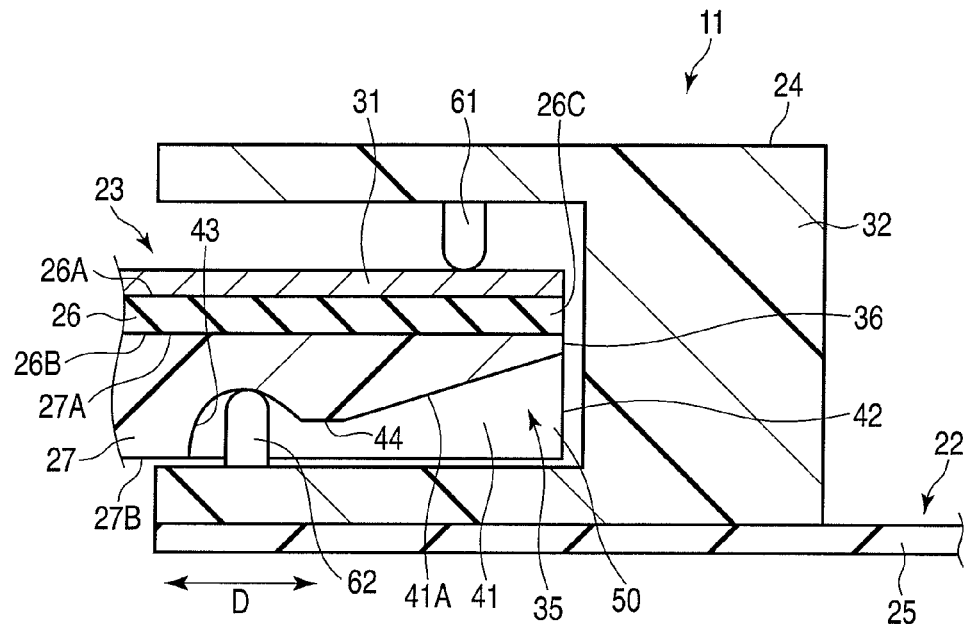
FIG. 10 is an exemplary longitudinal sectional view of a flexible printed wiring board and a connector that are incorporated in a portable computer according to a second embodiment.
Figure 11:
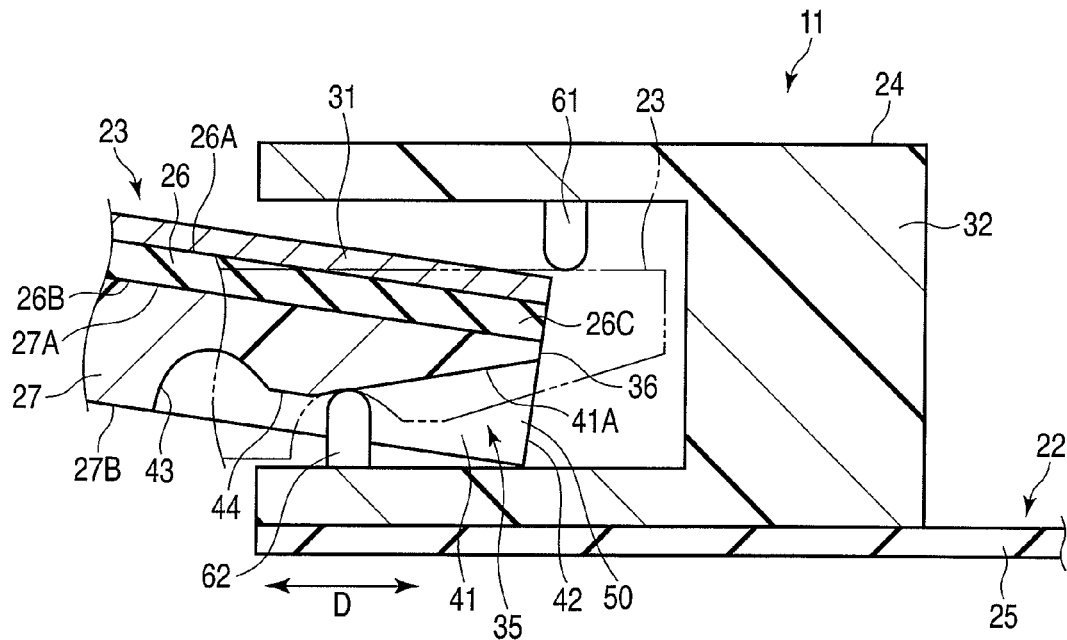
FIG. 11 is an exemplary sectional view illustrating a state in which the flexible printed wiring board starts to be inserted into the connector shown in FIG. 10.

Referring to FIGS. 10 and 11, an electronic device according to a second embodiment will be described. A portable computer 11 as an example of the electronic device of the second embodiment has substantially the same structure as that of the first embodiment except that first and second contacts 61 and 62 differ from the contacts of the first embodiment. In the second embodiment, the different elements will be mainly described. The similar elements are denoted by the corresponding reference numbers, and will not be described. The portable computer 11 of the second embodiment has the same appearance as that of the first embodiment shown in FIG. 1.

As is shown in FIG. 10, a connector 24 includes a housing 32 surrounding the periphery of the front end of a board main body 26, first contacts 61 (only one of which is shown) to be brought into contact with the conductors 31 (only one of which is shown) of the board main body 26, and second contacts 62 (only one of which is shown) to be brought into contact with the reinforcing plate 27 of a flexible printed wiring board 23. The first and second contacts 61 and 62 are formed of fixed pins. The first and second contacts 61 and 62 are examples of projections.

The first and second contacts 61 and 62 are displaced from each other in an insertion direction D in which the flexible printed wiring board 23 is inserted, in order, for example, to reduce the contact pressure of the contacts against the flexible printed wiring board 23. The first and second contacts 61 and 62 are electrically connected to the printed circuit board 22.

The connector 24 is a so-called top and bottom double contacts type connector. In the second embodiment, the first contacts 61 are made to be brought into contact with conductors 31, and the second contacts 62 are made to be brought into contact with a reinforcing plate 27. However, this may be modified such that the first contacts 61 are made to be brought into contact with the reinforcing plate 27, and the second contacts 62 are made to be brought into contact with the conductors 31.

In the second embodiment, when the front end 26C of the flexible printed wiring board 23 is inserted into the connector 24, the tip of the second contact 62 enters the opening 42 of the recess portion 35. When the front end 26C of the flexible printed wiring board 23 is further forwarded, the second contact 62 is guided along the tilted surface 41A of the recess portion 35. Since in the second embodiment, the first and second contacts 61 and 62 are fixed in position, the flexible printed wiring board 23 is slightly inclined in an insertion direction D as shown in FIG. 11, when it is inserted into the connector 24 or pulled therefrom.

After the second contact 62 passes the peak portion 44 of the flexible printed wiring board 23, it is fitted into the recess 43 of the flexible printed wiring board 23 as shown in FIG. 10 and as indicated by the two-dot chain line in FIG. 11. Thus, the flexible printed wiring board 23 is locked with respect to the connector 24.

In the second embodiment, the projections include the first contacts 61 made to be brought into contact with conductors 31, and the second contacts 62 made to be brought into contact with a reinforcing plate 27. The first and second contacts 61 and 62 are fixed pins, and are displaced from each other in an insertion direction D in which the flexible printed wiring board 23 is inserted. This structure cooperates with the structure of the reinforcing plate 27 to enable the flexible printed wiring board 23 to be guided to the correct position although the first and second contacts 61 and 62 are fixed in position. They also enable the contact pressure of the first and second contacts 61 and 62 to be appropriately adjusted.

Referring then to FIGS. 12 to 15, an electronic device according to a third embodiment will be described. A portable computer 11 as an example of the electronic device of the third embodiment has substantially the same structure as that of the first embodiment except for the structure of the flexible printed wiring board 23. In the third embodiment, the different elements will be mainly described. The similar elements are denoted by the corresponding reference numbers, and will not be described. The portable computer 11 of the third embodiment has the same appearance as that of the first embodiment shown in FIG. 1.

Figure 12:
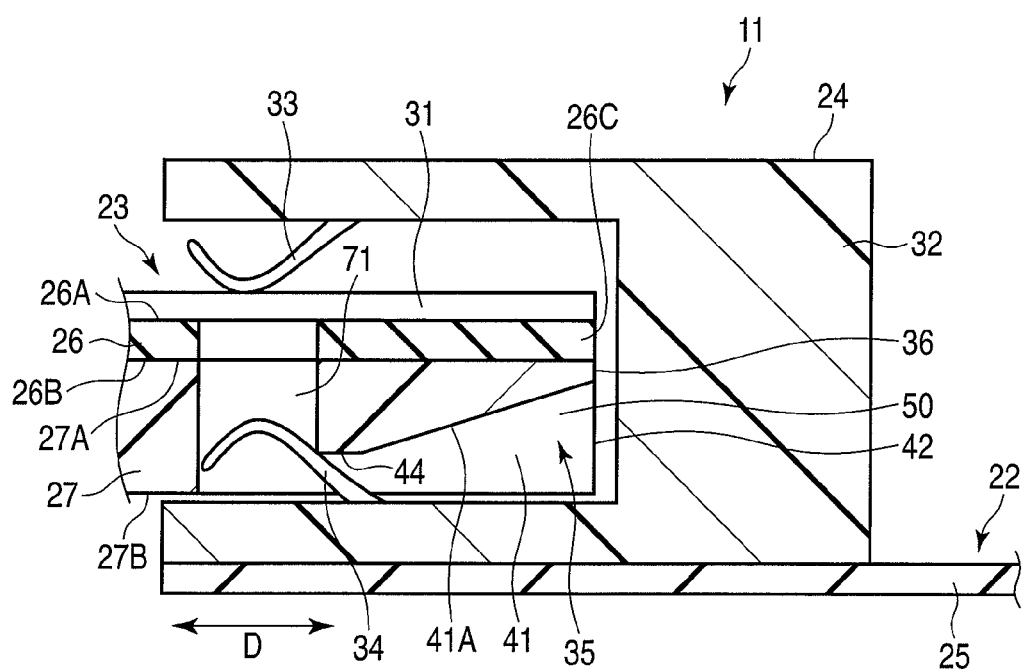
FIG. 12 is an exemplary longitudinal sectional view of a flexible printed wiring board and a connector that are incorporated in a portable computer according to a third embodiment.
Figure 13:
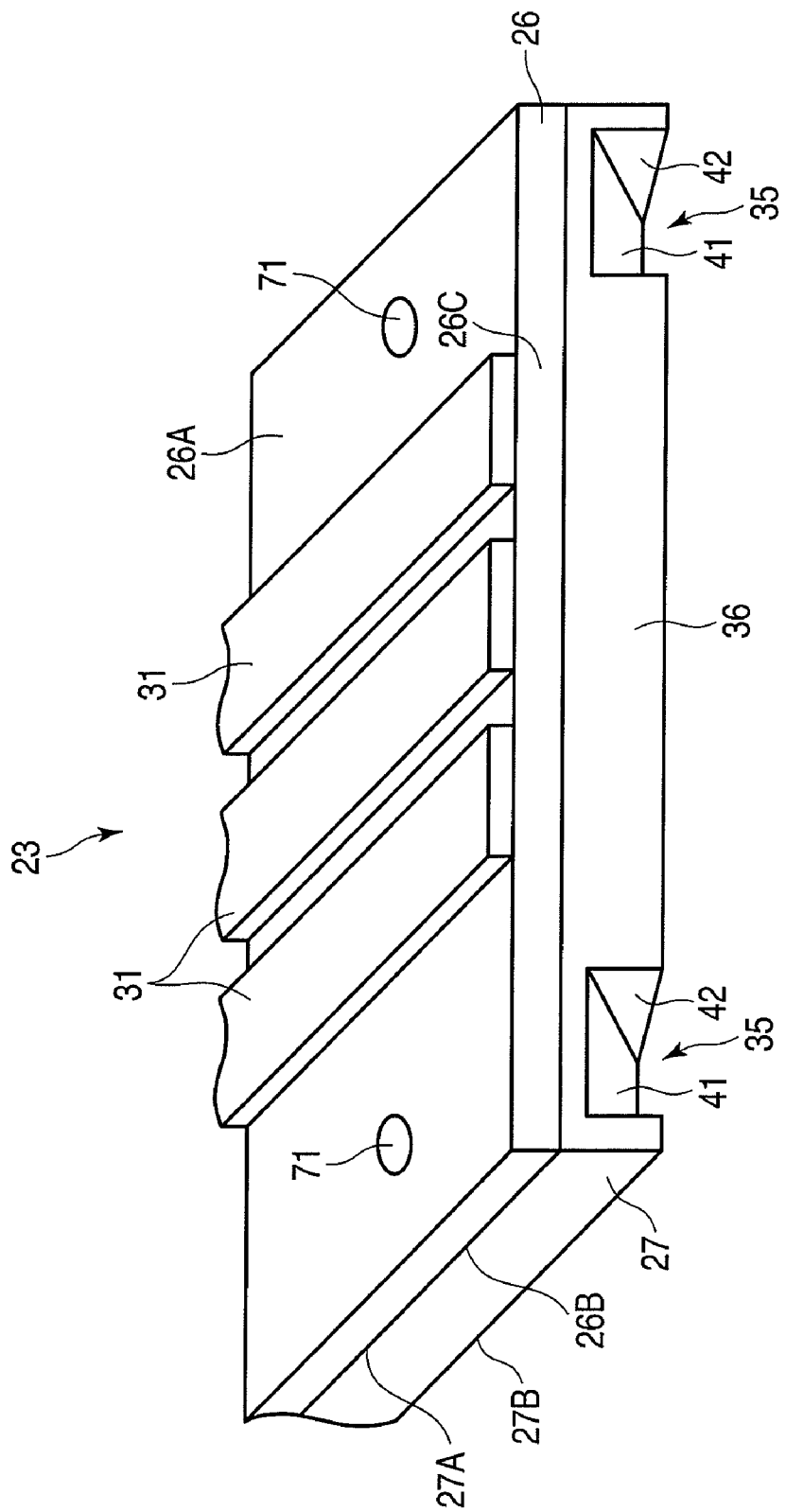
FIG. 13 is an exemplary perspective view of the flexible printed wiring board shown in FIG. 12.

As shown in FIGS. 12 and 13, the flexible printed wiring board 23 comprises a board main body 26, and a reinforcing plate 27 for reinforcing the board main body 26. The board main body 26 has a first surface 26A, a second surface 26B opposite to the first surface 26A, and a front end 26C to be brought into contact with a connector 24. Conductors 31 are provided on the first surface 26A. The conductors 31 are formed of, for example, copper foil.

The reinforcing plate 27 is formed of, for example, polyimide or polyethylene terephthalate (PET), and is a thick rectangular plate. The reinforcing plate 27 is attached to the second surface 26B of the board main body 26. The reinforcing plate 27 includes a first surface 27A on which the board main body 26 is attached, a second surface 27B opposite to the first surface 27A, and recess portions 35 formed in the second surface 27B. The reinforcing plate 27 also includes end faces 36 aligned with the front end 26C of the board main body 26.

Figure 14:
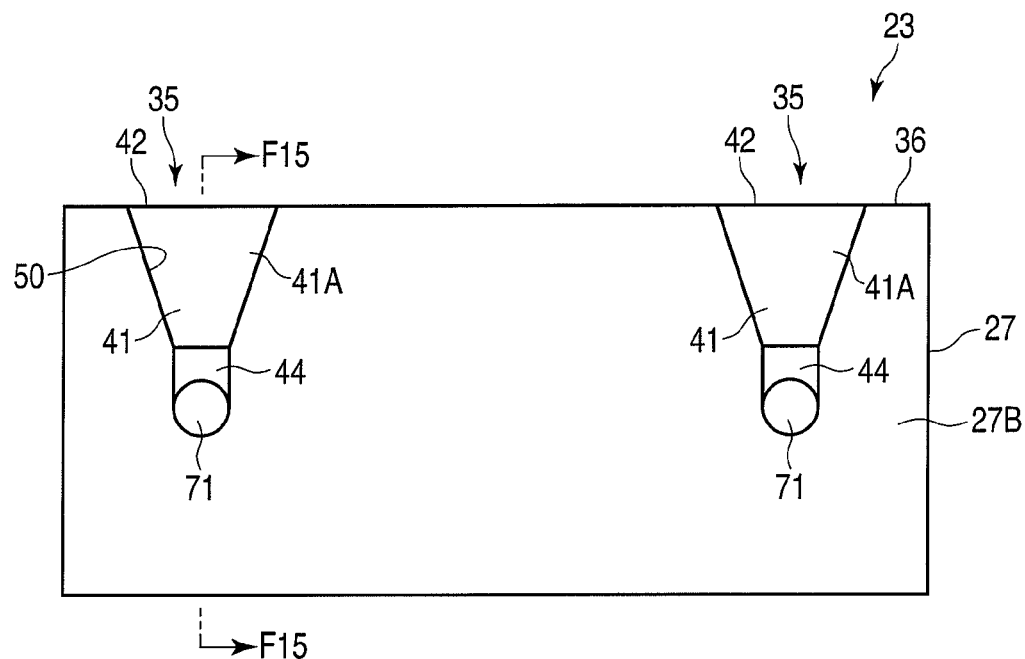
FIG. 14 is an exemplary bottom view of the flexible printed wiring board shown in FIG. 13.
Figure 15:
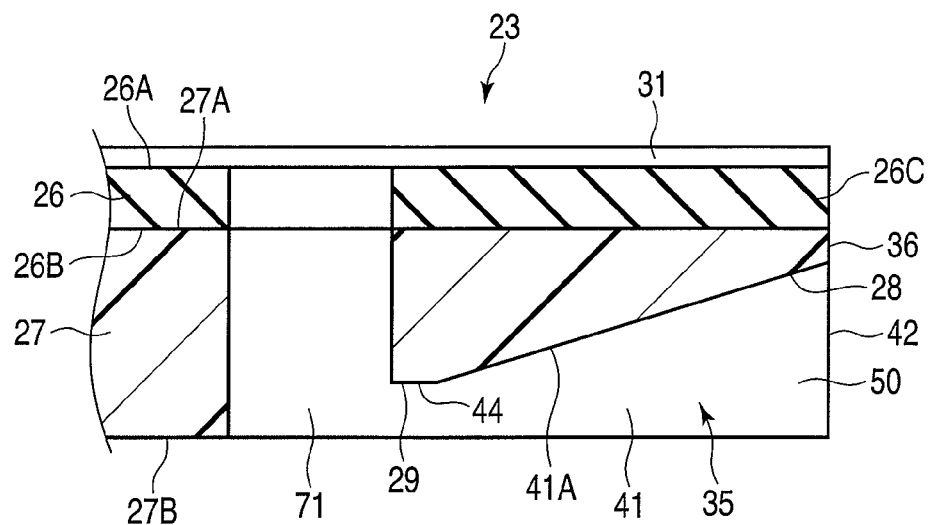
FIG. 15 is an exemplary sectional view taken along line F15-F15 of FIG. 14.

As shown in FIGS. 14 and 15, the recess portions 35 each includes a wall 50 that has a tilted and tapered surface 41A, and defines an opening 42 opening at the end face 36, an inner space 41, and a through hole 71 communicating with the inner space 41 and the opening 42. The surface 41A is tilted such that the depth of the recess portion 35 defined by the same is reduced toward the inside. The through hole 71 receives the corresponding second contact 34. The through hole 71 is formed through the walls of the reinforcing plate 27 and the board main body 26 along the thickness of the plate. The through hole 71 is formed by drilling the reinforcing plate 27 and the board main body 26. In the case of drilling, the through hole 71 can be formed at an accuracy with, for example, a tolerance of ±50 μm.

The space 41 and the opening 42 are formed by processing the reinforcing plate 27 using a laser. The depth of the space 41 is adjusted by controlling the energy of the laser and the number of shots of the laser. This enables each recess portion 35 to be formed at an accuracy with, for example, a tolerance of ±30 μm.

When the front end 26C of the flexible printed wiring board 23 is inserted into the connector 24, the tips of the second contacts 34 of the connector 24 enter the respective recess portions 35 of the flexible printed wiring board 23 through the opening 42 of the same. In this state, the front end 26C of the flexible printed wiring board 23 is further forwarded. At this time, the projections of the second contacts 34 are guided along the tilted surfaces 41A of the recess portions 35. After the second contacts 34 pass through the peak portions 44 of the recess portions 35, the projections of the contacts 34 are received in the respective though holes 71 as shown in FIG. 12. Thus, the flexible printed wiring board 23 is locked with respect to the connector 24.

In the above-described third embodiment, each recess portion 35 includes the through hole 71 formed in the portion of the reinforcing plate 27 away from the opening 42, and formed through the reinforcing plate 27 along the thickness of the same. This structure enables the flexible printed wiring board 23 to be prevented from being unintentionally disengaged from the connector 24.

Further, when the flexible printed wiring board 23 is most deeply inserted in the connector 24 to thereby cause the second contacts 34 to be press-fitted into the through holes 71, the user can confirm that the flexible printed wiring board 23 has been correctly inserted in the connector 24. Furthermore, since in the third embodiment, the through holes 71 are provided in place of the recesses 43 of the first embodiment, it is not necessary to delicately adjust the energy of the laser and/or the number of shots of the laser to form the recesses 43. The through holes 71 can be easily formed by drilling.

In addition, the first and second contacts 33 and 34 are plate springs, and hence have flexibility. This reduces the resistance of the flexible printed wiring board 23 that occurs when the board 23 is inserted into the connector 24, and accordingly realizes further smooth attachment of the board 23.

The connector 24 is a top and bottom double contacts type connector. This enhances the freedom degree of the layout of the flexible printed wiring board 23 and the connector 24. Since an existing top and bottom double contacts type connector can be used as the connector 24, it is not necessary to design a new connector, which reduces the manufacturing cost.

Figure 16:
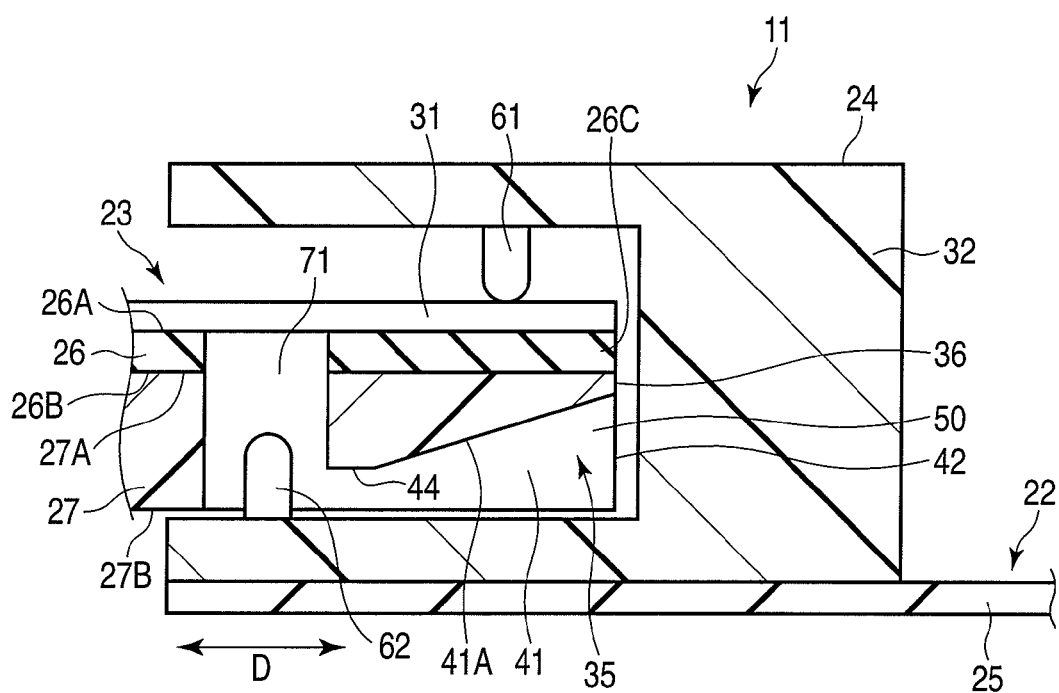
FIG. 16 is an exemplary longitudinal sectional view of a flexible printed wiring board and a connector that are incorporated in a portable computer according to a fourth embodiment.

Referring then to FIG. 16, an electronic device according to a fourth embodiment will be described. A portable computer 11 as an example of the electronic device of the fourth embodiment has substantially the same structure as that of the third embodiment except that first and second contacts 61 and 62 differ from the contacts of the third embodiment. In the fourth embodiment, the different elements will be mainly described. The similar elements are denoted by the corresponding reference numbers, and will not be described. The portable computer 11 of the fourth embodiment has the same appearance as that of the first embodiment shown in FIG. 1.

As shown in FIG. 16, the connector 24 includes a housing 32 surrounding the periphery of the front end of a board main body 26, first contacts 61 (only one of which is shown) to be brought into contact with the conductors 31(*only* one of which is shown) of the board main body 26, and second contacts 62 (only one of which is shown) to be brought into contact with the reinforcing plate 27 of a flexible printed wiring board 23. The first and second contacts 61 and 62 are formed of fixed pins. The first and second contacts 61 and 62 are examples of projections. The first and second contacts 61 and 62 are displaced from each other in an insertion direction D in which the flexible printed wiring board 23 is inserted, for example.

The connector 24 is a so-called top and bottom double contacts type connector. In the fourth embodiment, the first contacts 61 are made to be brought into contact with conductors 31, and the second contacts 62 are made to be brought into contact with a reinforcing plate 27. However, this may be modified such that the first contacts 61 are made to be brought into contact with the reinforcing plate 27, and the second contacts 62 are made to be brought into contact with the conductors 31.

In the fourth embodiment, when the front end 26C of the flexible printed wiring board 23 is inserted into the connector 24, the tip of the second contact 62 of the connector 24 enters the recess portion 35 of the flexible printed wiring board 23 through the opening 42 of the same. In this state, the front end 26C of the flexible printed wiring board 23 is further forwarded. At this time, the second contact 62 is guided along the tilted surface 41A of the recess portion 35. Since in the fourth embodiment, the first and second contacts 61 and 62 are fixed in position, the flexible printed wiring board 23 is slightly inclined in an insertion direction D as in the case of FIG. 11, when it is inserted into the connector 24 or pulled therefrom.

As shown in FIG. 16, after the second contact 62 passes the peak portion 44 of the flexible printed wiring board 23, it is received in the through hole 71, whereby the flexible printed wiring board 23 is locked with respect to the connector 24.

In the fourth embodiment, the first and second contacts 61 and 62 are fixed pins, and are displaced from each other in an insertion direction D in which the flexible printed wiring board 23 is inserted. This structure cooperates with the structure of the reinforcing plate 27 to enable the flexible printed wiring board 23 to be guided to the correct position, although the first and second contacts 61 and 62 are fixed in position.

The electronic device of the present invention is not limited to the portable computers 11 employed in the above-described embodiments, but may be another type of electronic device such as a cellular phone. Although in each of the above-described embodiments, the recess portions 35 are formed using a laser, the invention is not limited to this. The recess portions 35 may be formed by another means such as etching.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic device comprising:
   a connector;
   a flexible printed wiring board comprising a board main body and a reinforcing plate, the board main body comprising a first surface with a conductor on the first surface, a second surface opposite to the first surface, and a front end in contact with the connector, the reinforcing plate being on the second surface at the front end in order to reinforce the board main body; and
   a projection on the connector and in contact with the flexible wiring board,
   wherein the reinforcing plate comprises:
   a recess portion configured to receive the projection, and increased in size toward an end face of the reinforcing plate corresponding to the front end,
   an opening at the end face configured to connect to the recess portion, and
   a wall configured to define the recess portion,
   and the recess portion is in a surface of the reinforcing plate on an opposite side to a side facing the second surface of the board main body.

2. The electronic device of claim 1, wherein the depth of the recess portion is increased toward the end face.

3. The electronic device of claim 2, wherein the recess portion comprises a recess in a first end of the recess portion away from the opening and comprising a depth greater than the depth of the recess portion.

4. The electronic device of claim 2, wherein the recess portion comprises a through hole in a first end of the recess portion away from the opening, the through hole extending through the reinforcing plate along a thickness of the reinforcing plate.

5. The electronic device of claim 3, wherein the projection comprises a first contact on the conductor, and a second contact on the reinforcing plate, the first and second contacts being plate springs.

6. The electronic device of claim 5, wherein the connector is a top and bottom double contacts type connector.

7. The electronic device of claim 4, wherein the projection comprises a first contact attached to the conductor, and a second contact contacting the reinforcing plate, the first and second contacts being plate springs.

8. The electronic device of claim 7, wherein the connector is a top and bottom double contacts type connector.

9. The electronic device of claim 3, wherein the projection comprises a first contact on the conductor, and a second contact on the reinforcing plate, the first and second contacts being fixed pins comprising a distance between from each other in a direction in which the flexible printed wiring board is inserted into the connector.

10. The electronic device of claim 4, wherein the projection comprises a first contact on the conductor, and a second contact on the reinforcing plate, the first and second contacts being fixed pins comprising a distance from each other in a direction in which the flexible printed wiring board is inserted into the connector.

11. A flexible printed wiring board comprising:
    a board main body comprising a first surface with a conductor on the first face, a second surface opposite to the first surface, and a front end; and
    a reinforcing plate on the second surface at the front end and configured to reinforce the board main body, the reinforcing plate comprising a wall which defines a recess portion increased in size toward and opening to an end face of the reinforcing plate corresponding to the front end, the recess portion being in a surface of the reinforcing plate on an opposite side to a side facing the second surface of the board main body.

12. The flexible printed wiring board of claim 11, wherein the depth of the recess portion is increased toward the end face.

13. The flexible printed wiring board of claim 12, wherein the recess portion comprises a recess in a first end of the recess portion away from the opening and comprising a depth greater than the recess portion.

14. The flexible printed wiring board of claim 12, wherein the recess portion comprises a through hole in a first end of the recess portion away from the opening, the through hole extending through the reinforcing plate along a thickness of the reinforcing plate.

15. An electronic device comprising:
- a connector;
- a flexible printed wiring board comprising a front end in the connector;
- a projection on the connector and across a line of a direction in which the flexible printed wiring board is inserted;
- a reinforcing plate on a first surface of the flexible printed wiring board configured to reinforce the front end, the reinforcing plate comprising an end portion, a reinforcing portion thicker than the end portion, and a recess in the reinforcing portion configured to receive at least part of the projection;
- a wall extending from the end portion and the reinforcing portion of the reinforcing plate, the wall is configured to guide the projection between the end portion and the recess of the reinforcing plate in the direction in which the flexible printed wiring board is inserted.

* * * * *